(12) United States Patent
Lam et al.

(10) Patent No.: US 7,735,715 B2
(45) Date of Patent: Jun. 15, 2010

(54) DISPENSING SOLDER FOR MOUNTING SEMICONDUCTOR CHIPS

(75) Inventors: Kui Kam Lam, Kwai Chung (HK); Chun Hung Samuel Ip, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 82 days.

(21) Appl. No.: 11/952,296

(22) Filed: Dec. 7, 2007

(65) Prior Publication Data

US 2009/0145950 A1  Jun. 11, 2009

(51) Int. Cl.
B23K 31/02 (2006.01)
(52) U.S. Cl. .................... 228/180.21; 228/244; 228/260
(58) Field of Classification Search .................. None
See application file for complete search history.

(56) References Cited

U.S. PATENT DOCUMENTS

| | | | | |
|---|---|---|---|---|
| 3,797,725 A * | 3/1974 | Mori et al. | ...................... | 228/41 |
| 5,421,504 A * | 6/1995 | Spirig | .......................... | 228/41 |
| 5,605,276 A * | 2/1997 | Nagata | ....................... | 228/257 |
| 5,878,939 A * | 3/1999 | Luchinger et al. | ............. | 228/33 |
| 6,056,184 A | 5/2000 | Lüchinger et al. | ............. | 228/33 |
| 6,811,074 B2 * | 11/2004 | Suter et al. | ................... | 228/261 |
| 7,131,565 B2 * | 11/2006 | Gruber et al. | ................... | 228/8 |
| 7,296,725 B2 * | 11/2007 | Gruber et al. | ................... | 228/8 |
| 2003/0168498 A1 * | 9/2003 | Suter et al. | ................... | 228/256 |
| 2004/0035907 A1 * | 2/2004 | Radeck | ......................... | 228/41 |
| 2005/0109823 A1 * | 5/2005 | Gruber et al. | ................ | 228/246 |
| 2007/0164089 A1 * | 7/2007 | Gaugler | ....................... | 228/256 |
| 2008/0272112 A1 * | 11/2008 | Urech | ......................... | 219/616 |

FOREIGN PATENT DOCUMENTS

| | | |
|---|---|---|
| EP | 0 478 170 | 4/1992 |
| JP | 60-054270 | 3/1985 |
| JP | 60-262777 | 12/1985 |
| JP | 06-283853 | 10/1994 |
| JP | 2002-273567 A * | 9/2002 |

OTHER PUBLICATIONS

European Search Report mailed Apr. 7, 2009 in related European Patent Application No. 08020432.4.

* cited by examiner

*Primary Examiner*—Kiley Stoner
(74) *Attorney, Agent, or Firm*—Ostrolenk Faber LLP

(57) ABSTRACT

A method for mounting a semiconductor chip onto a substrate comprises the steps of positioning a solder dispenser over the substrate and passing a length of solder wire through the solder dispenser to the substrate. The feeding of the wire to the substrate in a feeding direction is controlled with a wire feeder. The solder dispenser is moved relative to the substrate with a positioning device along at least one of two orthogonal axes that are substantially perpendicular to the feeding direction contemporaneously with feeding the solder wire to the surface of the substrate to dispense a line of molten solder onto the substrate. The semiconductor chip is then mounted onto the molten solder that has been dispensed onto the substrate.

8 Claims, 3 Drawing Sheets

Solder writing path

Dispenser moving path without dispensing

DISPENSING SOLDER FOR MOUNTING SEMICONDUCTOR CHIPS

FIELD OF THE INVENTION

The present invention relates generally to the fabrication and packaging of integrated circuit components, and in particular, to the attachment of semiconductor chips to substrates by the use of solders.

BACKGROUND AND PRIOR ART

Semiconductor chips may be bonded onto metallic substrates such as lead frames by soldering. Specifically, power semiconductors are commonly fixed to lead frames by using soft solder. Power devices are widely used in the automotive industry due to their high thermal and electrical performance, and soft solder is generally chosen as the chip attach layer for such semiconductor packages. The soldered joint not only provides mechanical fixation of the chip, but it also ensures that heat which is produced in the semiconductor chip during operation is dissipated more efficiently than a joint comprising a non-conductive adhesive. Additionally, the soft solder provides a good electrical path for the semiconductor chips.

In cases where there is an increase in power density of the semiconductor chip, a soldered joint having a stipulated thickness is required. The layer of solder should wet the entire area of the semiconductor chip evenly. Furthermore, it should be completely free from air cavities and contamination by impurities. The solder should not protrude from the edges nor spread beyond the surface area of the bond pad, in what is known as bleeding. To achieve this, the stipulated amount of solder should be dispensed and accurately positioned onto the substrate before bonding the semiconductor chip.

Typically, soft soldering of a semiconductor chip to a lead frame entails dispensing an amount of solder onto the lead frame before positioning the chip. This may involve touching one end of a solder wire at the position of the lead frame where the chip is to be located. The lead frame is preheated to a temperature which is above the melting point of the solder so that the solder wire melts upon contact with the lead frame. A prescribed length of the wire is fed to the lead frame and it is continuously or intermittently melted onto the lead frame. The solder wire which does not melt is then pulled back leaving a droplet of solder on the lead frame. The solder droplet remains molten when the lead frame is maintained at a temperature above the melting point of the solder. Surface tension in the molten solder leads to the formation of dome-shaped droplets on the lead frame, which inhibits the formation of a flat and even solder layer under the entire chip surface when the chip is bonded onto the solder. An additional factor that affects the proper formation of an evenly-spread layer of solder is the possible lateral deviation of the solder droplet when it is being positioned on the lead frame. It is therefore essential to modify the shape of the droplets of solder to achieve a thin and evenly spread-out layer before positioning the chip.

A conventional method to modify the shape of a solder droplet utilizes spankers. The substrate carrying a solder droplet is transferred to a spanking zone where a spanker in the form of a rectangular mold is located. The rectangular mold moves downwards to contact the solder droplet and to spread it inside the spanker mold cavity to form a rectangular footprint. A spanker typically comprises a shaft which can be lifted or lowered with respect to the substrate, and a stamp or punch connected to it wherein the stamping or punching surface faces the substrate. Deviations in thickness and position of the substrate as well as possible slanting of the substrate may adversely affect the thickness and lateral distribution of the solder. Even slight deviations in the angle between the punch surface and the surface of the substrate may lead to considerable lateral displacement of solder droplets. Additionally, flattening the solder droplets by means of the spanking stamp or punch results in solder spots which may be more or less rounded at their edges and which do not conform exactly to the rectangular or square shape of the chips.

U.S. Pat. No. 6,056,184 entitled "Apparatus for Shaping Liquid Portions of Solder in Soft Soldering Semiconductor Chips" discloses a punch with a distance keeping means for shaping spherically domed liquid solder into flat solder applications to achieve an evenly distributed and correctly positioned layer of soft solder. The punch is spring mounted with respect to a shaft and slewable in all directions in relation to the axis of motion of the shaft. The movable punch allows self-adjustment in relation to the substrate such that a fixed distance from the substrate can be maintained even when the substrate is tilted. The distance keeping means affixed to the punch protrudes beyond the lower surface of the punch and is adapted to touch down onto the substrate. The distance keeping means has a rim which actively limits and centers the solder mass when it is spread over the substrate. Therefore, lateral deviations in the position of the applied solder-droplets will not affect formation of an even layer of solder under the punch surface. Furthermore, this apparatus renders it unnecessary to observe a predefined precise height or distance of the punch surface from the substrate when lowering the shaft.

Unfortunately, an uneven layer of solder may form between the chip and the substrate and in particular, the area around the edge of the chip may not be wetted by the molten solder. Moreover, when an excessive amount of molten solder is applied, solder splash may result when the mounting head presses on the chip onto the molten footprint.

It is thus important to dispense the amount of solder accurately and precisely. U.S. Pat. No. 5,878,939 entitled "Method and Apparatus for Dispensing Liquid Solder" discloses a dispenser which controls the solder wire's rate of feed to accurately regulate the amount of solder dispensed. The apparatus comprises a guide tube through which solid solder is gradually fed. The end of the tube is heated to liquefy the solder. At the same time, an adjacent zone of the guide tube is cooled to maintain a stable temperature transition in the tube. The amount of molten solder available above an outlet for the molten solder is thus controlled. This patent also discloses a spanker in the form of a molding die with a molding cavity on its underside to determine and restrict the surface wetted by the molten solder.

After spanking, the substrate bearing the rectangular footprint of molten solder is transferred to a chip mounting zone. A chip is bonded onto the rectangular solder footprint by a mounting head. The pressure on the chip is released when the mounting head moves away from the solder. The surface tension of the molten solder leads to solder flow back beneath the chip. Finally, the substrate goes through a cooling section and the layer of solder solidifies. To prevent the solder from oxidizing, chip attachment is performed under a protective or reducing atmosphere.

There are disadvantages in using the spanking method to achieve a thin and even layer of molten solder. If insufficient solder is used, especially where a large solder dot volume is required, the molten solder cannot fill up the mold cavity to form an evenly distributed footprint. This affects the bonding strength between the chip and the substrate. On the other hand, when too much solder is applied, it will lead to solder splash. Whilst this problem may be overcome by the invention under U.S. Pat. No. 5,878,939 as described above, there is an additional need to control the quality of the spanker mold fabricated so as to minimize wetting by the liquid solder which may form contaminants in the mold cavity of the spanker. Contaminants reduce the volume of the molten solder, creating voids and weakening chip adhesion and electrical conductivity. Tilted spanker molds that may result from defective fabrication will also lead to incomplete solder footprints that affect the quality of the final product. Moreover, it is difficult to achieve complex solder footprints using spanker mold technology.

It is therefore desirable to devise alternative methods of obtaining an evenly distributed layer of molten solder for soldering a semiconductor chip to a substrate to avoid the disadvantages associated with using spankers.

SUMMARY OF THE INVENTION

It is thus an object of the invention to seek to provide a soft solder dispenser for forming a layer of evenly-distributed solder for attaching semiconductor chips to substrates which does not present the aforesaid shortcomings that are faced when using spankers of the prior art.

According to a first aspect of the invention, there is provided a method for mounting a semiconductor chip onto a substrate, comprising the steps of: positioning a solder dispenser over the substrate and passing a length of solder wire through the solder dispenser to the substrate; controlling the feeding of wire to the substrate with a wire feeder in a feeding direction; moving the solder dispenser relative to the substrate with a positioning device along at least one of two orthogonal axes that are substantially perpendicular to the feeding direction contemporaneously with feeding solder wire to the surface of the substrate in order to dispense a line of molten solder onto the substrate; and thereafter mounting the semiconductor chip onto the molten solder that has been dispensed onto the substrate.

According to a second aspect of the invention, there is provided an apparatus for dispensing solder onto a substrate for mounting a semiconductor chip, comprising: a solder dispenser positionable over the substrate and through which a length of solder wire is passed for feeding the solder wire to the substrate; a wire feeder to control feeding of the solder wire to the substrate in a feeding direction; and a positioning device configured for moving the solder dispenser relative to the substrate along at least one of two orthogonal axes that are substantially perpendicular to the feeding direction; wherein the positioning device is operative to move the solder dispenser relative to the substrate along at least one of the two orthogonal axes contemporaneously with the wire feeder feeding wire to the substrate, whereby to dispense a line of molten solder onto the substrate.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
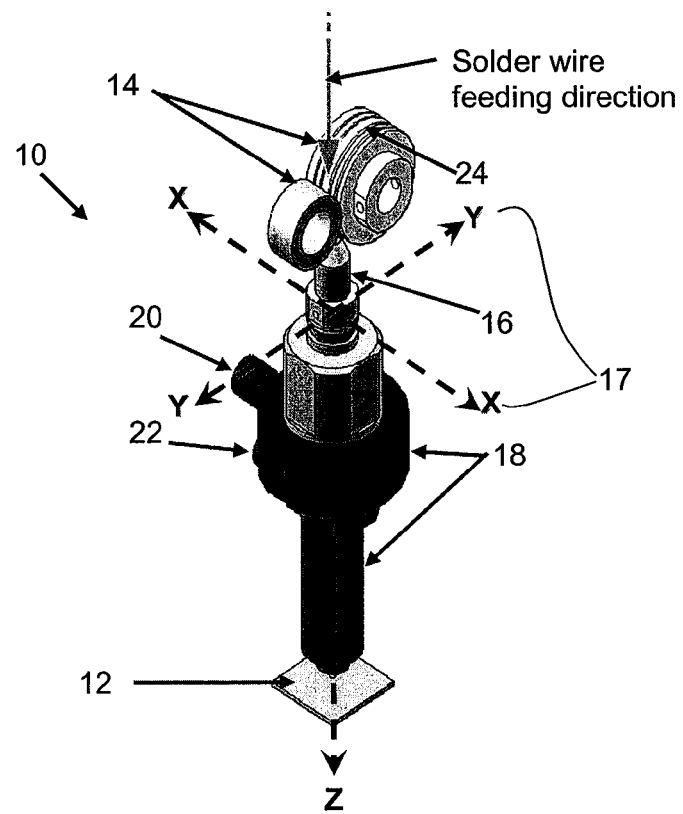
FIG. 1 is an isometric view of a solder dispenser for dispensing soft solder onto a lead frame according to the preferred embodiment of the invention.

FIG. 1 is an isometric view of a solder dispenser 10 for dispensing soft solder onto a substrate such as a lead frame 12 for mounting a semiconductor chip according to the preferred embodiment of the invention. The solder dispenser 10 is positionable over the lead frame 12 and a length of solder wire 24 is passed through the solder dispenser 10 for feeding the solder wire 24 to the lead frame 12. A wire feeder may comprise a pair of press rollers 14 which cooperate so that the solder wire 24 can be engaged through the rollers for controlled feeding of the solder wire 24 into the dispenser 10 and towards the lead frame 12 in a feeding direction. The feeding direction is in the z direction in FIG. 1. A solder wire guiding nut 16 guides the solder wire 24 through a centrally-located hole in the dispenser 10.

A positioning device, such as an X-Y table 17, is preferably coupled to the solder dispenser 10 and configured for moving the solder dispenser 10 relative to the lead frame 12 along at least one of two orthogonal axes that are substantially perpendicular to the wire feeding direction. In the described embodiment, the two orthogonal axes are the x and y axes. The solder dispenser 10 is drivable in the x and y directions by the X-Y table 17, and is able to dispense solder in any x-y direction, such as diagonally onto the lead frame 12, as it moves. The X-Y table 17 may therefore move the solder dispenser 10 relative to the lead frame 12 along at least one of the x and/or y axes contemporaneously with the press rollers 14 feeding wire to the lead frame 12 in the z axis, whereby to dispense molten solder onto the lead frame 12.

The dispenser 10 further has a solder wire cooling tube 18 for dissipating heat received from a heat tunnel on which the lead frame 12 is resting. The cooling tube 18 is also connected to a cooling gas supply via a cooling gas inlet 20. Cooling gas is injected into the cooling tube 18 through the cooling gas inlet 20 and leaves through a cooling gas outlet 22, carrying away the heat received from the heat tunnel. This cooling process is important to maintain the dispenser 10 at an ambient temperature and to ensure that the solder wire 24 remains in solid form within the dispenser.

Figure 2:
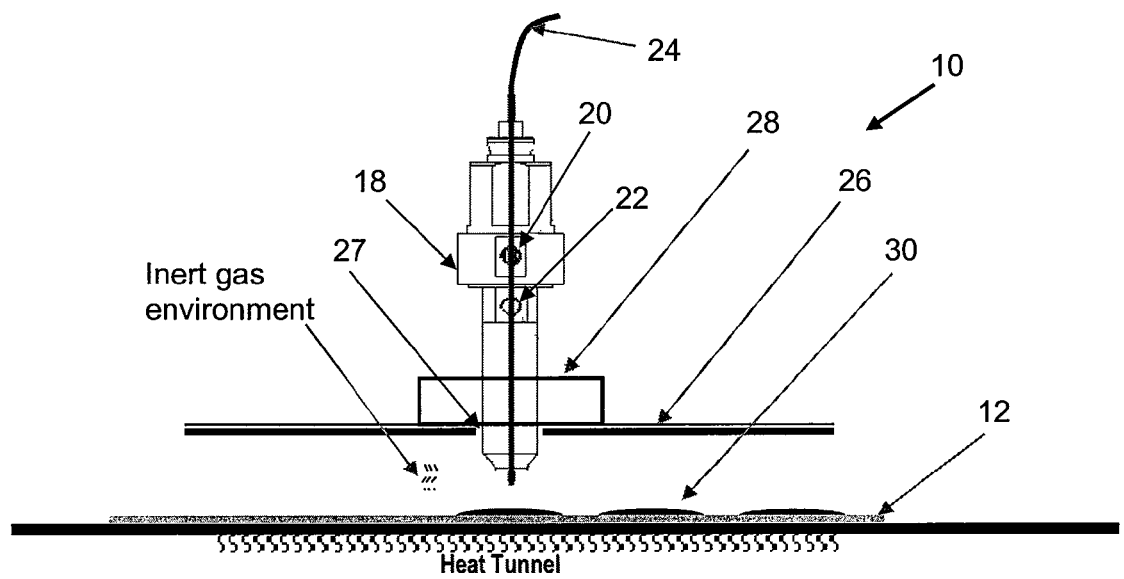
FIG. 2 is a side view of the solder dispenser of FIG. 1.

FIG. 2 is a side view of the solder dispenser 10 of FIG. 1. The lead frame 12 is resting on a heat tunnel and is heated to the working temperature of the solder wire 24. A heat tunnel cover 26 is positioned above the lead frame 12 and acts as both a heat shield for the dispenser 10 as well as providing an inert gas environment above the lead frame to reduce oxidation of the written solder 30 that has been dispensed onto the lead frame 12. The heat cover 26 has an opening 27 which is configured to allow the dispenser 10 to extend through the opening and to move in the x and y directions during solder writing onto the lead frame 12. A slider cover 28 is attached to the dispenser 10 and is operative to cover the opening 27 either substantially or completely. It further helps to contain the heat beneath the heat tunnel cover 26 and at the same time helps to maintain the inert gas environment.

During the process of soldering a semiconductor chip to the lead frame 12, a predetermined length of solder wire 24 is controllably fed towards the lead frame 12 by the press guides 14. The solder wire 24 is fed onto chip bonding sites on the lead frame 12 by way of holding onto one end of the solder wire 24 while the other end of the wire 24 is melted onto the heated lead frame 12. A predetermined quantity of solder is dispensed in a pattern that is suitable for achieving a thin, evenly distributed layer of molten solder for bonding the respective chip. The x and y axes motion of the dispenser 10 not only allows formation of any design of solder pattern on the lead frame 12, but it also permits affixing various sizes of chips onto the lead frame 12. For example, since a large x to y ratio is possible, the dispenser 10 according to the preferred embodiment of the invention can be applied to a chip with a large length to width ratio such as 200×50 mils. The parameters that control the flow of molten solder onto the lead frame 12 are generally the melting speed of the solder wire 24 and the speed of x-y motion of the dispenser 10. The melting speed of the solder wire 24 is in turn dependent on the feeding rate of the solder wire 24 onto the lead frame 12. Lines of molten solder can be written onto the lead frame 12 forming different types of solder patterns as appropriate for affixing a semiconductor chip.

In one particularly preferred embodiment of this invention, the lead frame 12 is heated to about 360° C., the X-Y table 17 is operative to move the solder dispenser 10 substantially at a speed of 160 mm/s and the melting or feeding rate of the solder wire 24 to the lead frame 12 is substantially at about 5 mm/s. The flow speed of molten solder determines the thickness of the molten solder for bonding. This may be regulated by controlling the two parameters as described above to prevent bleeding out of solder when a chip is placed onto solder that has been dispensed onto the lead frame 12. When the chip is positioned and placed onto the lead frame 12, the written solder 30 flows beneath the chip to form an even and continuous layer of solder between the chip and the lead frame 12. The bonded chip on the lead frame 12 is then cooled to form a reliable electrical and thermal joint between the chip and the lead frame 12. The foregoing steps are repeated for a plurality of chips, which allows precise positioning of the chips in close proximity to one other.

Figure 3A:
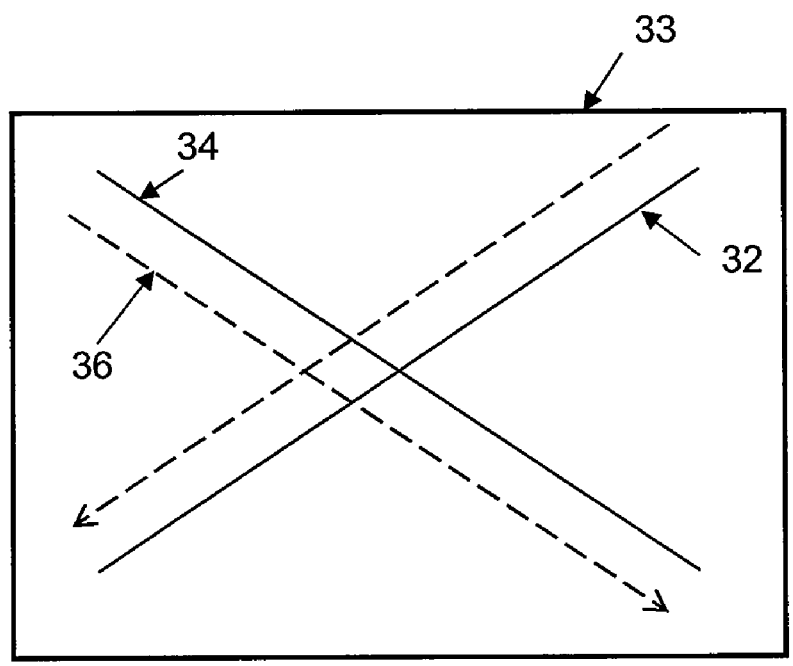
FIGS. 3A and 3B illustrate different manners of solder writing utilizing the solder dispenser of FIG. 1.
Figure 3B:
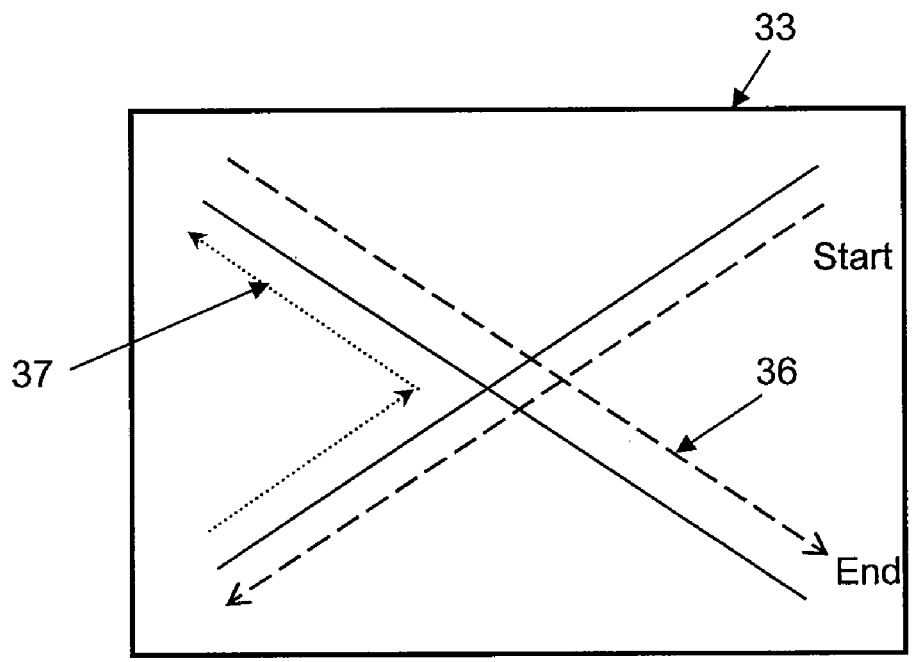
Figure 3B:
Figure 3B:
Figure 4A:
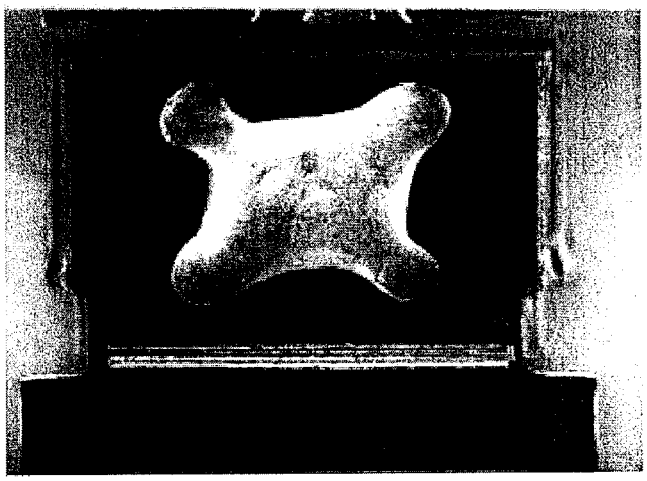
FIGS. 4A to 4C illustrate exemplary solder footprints that are achievable from solder writing utilizing the said solder dispenser.
Figure 4B:
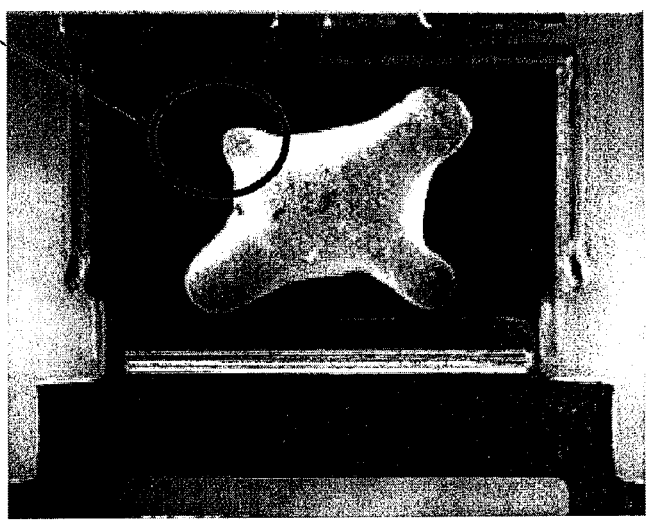
Figure 4C:
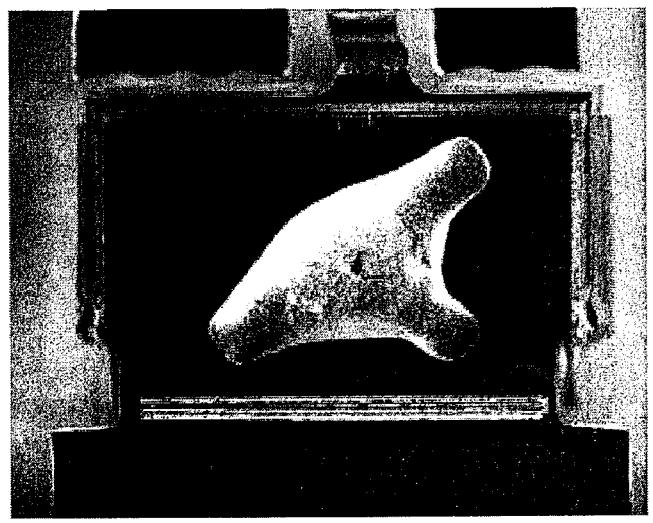

FIGS. 3A and 3B illustrate different manners of solder writing utilizing the solder dispenser 10 of FIG. 1 whereas FIGS. 4A to 4C illustrate exemplary solder patterns that are achievable from solder writing utilizing the said solder dispenser 10. In FIG. 3A, an area 33 of the lead frame 12 corresponding to a surface area of a chip to be bonded is divided into first and second dispensing segments 32, 34. The first and second dispensing segments 32, 34 are preferably located on the lead frame 12 such as to extend substantially diagonally across a surface area of a square or rectangular semiconductor chip to be mounted.

In the first manner of solder writing, the dispenser 10 first dispenses the solder wire 24 on the first and second dispensing segments 32, 34 along a first path 36. Thereafter, a wire contact search is carried out to locate the commencing point on the second segment 34 for initiating solder writing onto the second segment 34. The resultant solder pattern formed is symmetrical about a central meeting point of the first and second dispensing segments 32, 34 as illustrated in FIG. 4A. This solder pattern will spread out evenly under a chip when the chip is placed centrally onto the solder pattern. It has been found that solder bleeding may be avoided with this solder pattern. Hence, this is the recommended way of solder writing to achieve an even layer of molten solder to affix a chip onto the lead frame 12.

In comparison, in a second manner of solder writing, the dispenser 10 dispenses the wire 24 along the first dispensing segment 32 before moving to the commencing point of the second dispensing segment 34. However, no wire contact search for the initiating point is conducted before solder writing begins on the second dispensing segment 34. The result of such a solder writing pattern is illustrated in FIG. 4B. The solder does not wet a corner 38 of the lead frame, thus resulting in a solder layer that is asymmetrical about the meeting point of the first and second dispensing segments 32, 34, unlike the solder pattern of FIG. 4A. As a result, when a chip is pressed onto the lead frame 12, an uneven layer of solder may tend to form under the chip.

A third manner of solder writing is illustrated in FIG. 3B. No solder is dispensed on the lead frame 12 along part of the dispensing path 37 of the dispenser 10. An asymmetrical solder pattern forms as shown in FIG. 4C as in the case of the pattern of FIG. 4B. An uneven layer of solder may be formed under the chip as a result. By comparing the patterns created in all three manners of solder writing, it can be seen that FIG. 4A illustrates the most desirable pattern to obtain an evenly distributed solder layer for affixing a chip onto the lead frame 12.

It should be appreciated that the preferred embodiment of the solder dispenser described above provides an effective method of solder writing to obtain an evenly distributed solder for affixing a chip firmly onto a lead frame while reducing the problem of solder bleeding. In fact, it has been noted that whilst a certain amount of solder (eg. 2000 μm) causes bleeding in a conventional solder dispensing method using spankers, the same amount of solder written in the manner described in the preferred embodiment of the invention does not cause solder bleeding.

The x and y directional motions of the dispenser 10 further provides the advantage of solder pattern control. Any sophisticated solder pattern that is desired is possible due to the directional freedom of motion of the dispenser as compared to conventional spankers. In contrast, the only motion possible to dispensers of the prior art is to adjust the solder wire 24 up or down along the z-axis when dispensing solder droplets.

Furthermore, in the case of prior art dispensing methods that utilise spankers, the solder patterns formed are limited by the spanker molds that are available. Different spanker molds have to be fabricated when a different solder pattern is required or when different volumes of solder are to be dispensed due to different chip sizes. Using the spanking method is therefore costly. In fact, the elimination of the use of spankers altogether reduces the cost of the overall system tremendously. Besides cutting down costs, elimination of spankers also does away with the extra requirement of quality control during mold fabrication of spankers. In the absence of a spanking zone, another advantage is that a shorter heat tunnel is possible. A more compact overall system construction is thus achieved.

In the conventional dispensing method that uses spankers on solder droplets, it is not possible to regulate the thickness of the solder layer. On the contrary, controlling the parameters of the melting speed of the solder wire as well as the motion speed of the dispenser during its x-y motion regulates the volume and the flow of the molten solder for writing patterns. This allows more precise control of the thickness of the solder lines on the lead frame using the dispenser according to the preferred embodiment of the invention. The thickness of the solder layer that is used to mount a semiconductor chip can be better controlled as compared to using spankers.

The invention described herein is susceptible to variations, modifications and/or additions other than those specifically described and it is to be understood that the invention includes all such variations, modifications and/or additions which fall within the spirit and scope of the above description.

The invention claimed is:

1. Method for mounting a semiconductor chip onto a substrate, comprising the steps of:
    positioning a solder dispenser over the substrate and passing a length of solder wire through the solder dispenser to the substrate;
    controlling the feeding of wire to the substrate with a wire feeder in a feeding direction;
    moving the solder dispenser relative to the substrate with a positioning device along at least one of two orthogonal axes that are substantially perpendicular to the feeding direction contemporaneously with feeding solder wire to the surface of the substrate in order to dispense a line of molten solder onto the substrate; and thereafter
    mounting the semiconductor chip onto the molten solder that has been dispensed onto the substrate; the method further comprising the steps of:
    covering the substrate with a cover having an opening through which the solder dispenser extends, the opening being configured such as to allow the solder dispenser to move in at least one of the two orthogonal axes; and
    covering the opening with a slider cover which is attached to the solder dispenser and which is movable with the solder dispenser.

2. Method as claimed in claim 1, wherein the positioning device is coupled to the solder dispenser.

3. Method as claimed in claim 1, further comprising the step of dissipating heat received by the solder dispenser via a cooling tube in the solder dispenser.

4. Method as claimed in claim 3, further comprising the step of introducing a supply of cooling gas to the cooling tube, and thereafter removing gas that is heated by gas received by the solder dispenser away from the solder dispenser.

5. Method as claimed in claim 1, wherein the step of dispensing a line of molten solder onto the substrate further comprises the step of holding to one end of the solder wire to continuously feed solder wire to the substrate while moving the solder dispenser along at least one of the two orthogonal axes.

6. Method as claimed in claim 1, wherein the wire is fed at a feeding rate of substantially 5 mm/s and the speed of movement of the solder dispenser along at least one of the two orthogonal axes is substantially at 160 mm/s.

7. Method as claimed in claim 1, wherein the solder dispenser dispenses solder along first and second dispensing segments which are symmetrical about a central meeting point of the first and second dispensing segments.

8. Method as claimed in claim 7, wherein the first and second dispensing segments are located on the substrate such as to extend substantially diagonally across a surface area of a square or rectangular semiconductor chip to be mounted.

* * * * *